United States Patent [19]
Gardner et al.

[11] Patent Number: 6,090,676
[45] Date of Patent: Jul. 18, 2000

[54] PROCESS FOR MAKING HIGH PERFORMANCE MOSFET WITH SCALED GATE ELECTRODE THICKNESS

[75] Inventors: Mark I. Gardner, Cedar Creek; H. Jim Fulford; Charles E. May, both of Austin, all of Tex.

[73] Assignee: Advanced Micro Devices, Inc., Sunnyvale, Calif.

[21] Appl. No.: 09/149,210

[22] Filed: Sep. 8, 1998

[51] Int. Cl.⁷ .................................................. H01L 21/336
[52] U.S. Cl. .................... 438/303; 438/301; 438/306; 438/585
[58] Field of Search .................... 438/303, 299, 438/301, 306, 307, 585, 595, 596

[56] References Cited

U.S. PATENT DOCUMENTS

| | | | |
|---|---|---|---|
| 4,818,715 | 4/1989 | Chao | 257/344 |
| 4,907,048 | 3/1990 | Huang | 257/344 |
| 5,541,127 | 7/1996 | Hoshiko et al. | 438/585 |
| 5,654,218 | 8/1997 | Lee | 438/303 |
| 5,759,899 | 6/1998 | Saito | 438/303 |
| 5,880,015 | 3/1999 | Hata | 438/669 |
| 5,882,974 | 3/1999 | Gardner et al. | 438/305 |

FOREIGN PATENT DOCUMENTS

| | | |
|---|---|---|
| 2-188924 | 1/1989 | Japan . |
| 03 003245 | 5/1989 | Japan . |
| 8-330583 | 5/1995 | Japan . |

OTHER PUBLICATIONS

Pfiester et al., An ITLDD CMOS Process with Self–Aligned Reverse–Sequence LDD/Channel Implantation, IEEE Transactions on Electron Devices, vol. 38, No. 11 (Nov. 1, 1991).

*Primary Examiner*—Michael Trinh
*Attorney, Agent, or Firm*—Crawford PLLC

[57] ABSTRACT

A process for making a high performance MOSFET with a scaled gate electrode thickness. In one embodiment, the process comprises first providing a substrate. A gate dielectric layer is formed on the substrate, and a gate electrode is formed on the gate dielectric layer. A middle portion of the gate electrode has a first height, and side portions of the gate electrode have heights that are less than the first height. A dopant species is implanted at a first energy level and at a first concentration, whereby lightly doped drain regions are formed in the substrate below the side portions of the gate electrode.

23 Claims, 2 Drawing Sheets

PROCESS FOR MAKING HIGH PERFORMANCE MOSFET WITH SCALED GATE ELECTRODE THICKNESS

FIELD OF THE INVENTION

The present invention is directed generally to semiconductor structures and, more particularly, a process for manufacturing high performance MOSFETs having scaled gate electrode thicknesses.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

A typical MOS semiconductor device generally includes a gate electrode, which acts as a conductor, to which an input signal is typically applied via a gate terminal. Heavily doped source/drain regions are formed in a semiconductor substrate and are respectively connected to source and drain terminals. A channel region is formed in the semiconductor substrate beneath the gate electrode and separates the source/drain regions. The channel is typically lightly doped with a dopant type opposite that of the source/drain regions. The gate electrode is physically separated from the semiconductor substrate by a gate insulating layer, typically an oxide layer such as $SiO_2$. The insulating layer is provided to prevent current from flowing between the gate electrode and the source/drain regions or channel region.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source/drain regions. In this manner an electric field controls the current flow through the channel region. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

Several objectives influence MOSFET design and fabrication. First, there is a desire to reduce the dimensions of the MOSFET. Increasing the number of individual MOSFETs that can be placed onto a single silicon chip or die produces increased functionality per chip. Second, there is a continual desire to improve performance, and particularly the speed, of the MOSFET transistors. This pursuit is manifested in shorter conduction channel lengths and in efforts to obtain low contact resistivity at the MOSFET junctions. These aspects offer increased MOSFET speed and allow for a greater number of operations to be performed by the MOSFET in less time. MOSFETs are used in great quantity in computers where the push to obtain higher operation cycle speeds demands faster MOSFET performance. Lastly, there exists a constant need to minimize costly MOSFET fabrication steps.

As the feature dimensions of the MOSFET device decrease, new performance hurdles present themselves. One particular difficulty concerns electrical shorts between MOSFET devices and capacitive coupling between the closely stacked MOSFET structures. As the MOSFETs are pushed into a more dense arrangement there is a heightened tendency for stray electrical signals to pass from device to device. The stray electrical signals cause the MOSFETs to malfunction or possibly breakdown entirely.

As shown above, heightened speed and reduced dimensions may lead to MOSFET breakdown. Conventional approaches have encountered difficulty trying to maintain performance in the face of decreasing size and increasing density of devices. In attempting to overcome these hurdles, it is equally desirable to keep costly processing steps to a minimum. Therefore, it is desirable to provide a semiconductor structure and provide a process for its manufacture to address the above identified problems.

SUMMARY OF THE INVENTION

Generally, the present invention relates to a process for making a semiconductor structure which involves scaling the size of the gate electrode of a transistor. In one embodiment, the process comprises first providing a substrate. A gate dielectric layer is formed on the substrate, and a gate electrode is formed on the gate dielectric layer. A middle portion of the gate electrode has a first height, and side portions of the gate electrode have heights that are less than the first height. A dopant species is implanted at a first energy level and at a first concentration, whereby lightly doped drain regions are formed in the substrate below the side portions of the gate electrode.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
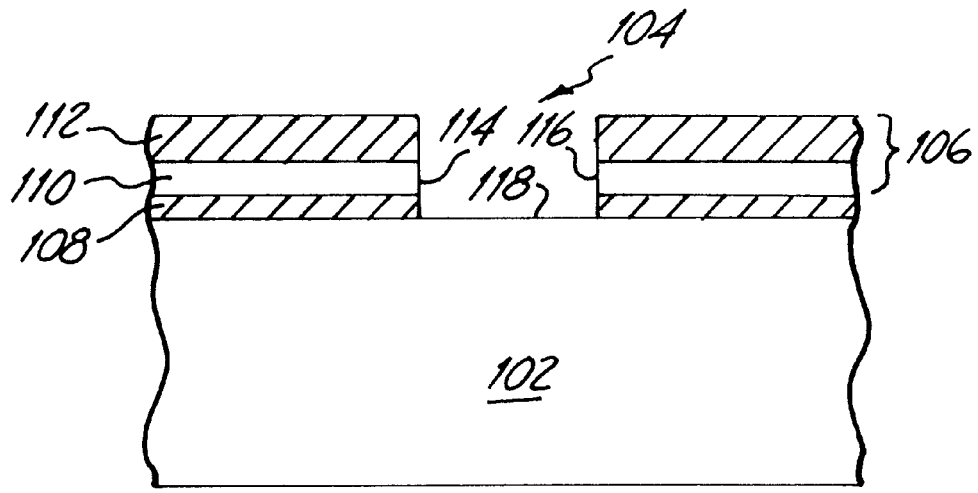
FIG. 1 is a partial cross-sectional view of a semiconductor substrate upon which an opening is etched in a oxide-nitride-oxide stack.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of semiconductor transistor arrangements. The invention has been found to be particularly advantageous in applications such as PMOS, NMOS, CMOS, and BiCMOS devices. While the present invention is not so limited, an appreciation of various aspects of the invention is best gained through a discussion of various application examples of processes used to form such semiconductor devices.

FIGS. 1–5 illustrate semiconductor structures at various stages in a process flow in accordance with example embodiments of the invention. FIG. 1 is a partial cross-sectional view of a semiconductor substrate 102 upon which an opening is etched in a oxide-nitride-oxide stack 106. In an example CMOS embodiment, the substrate 102 is a p+ silicon bulk which incorporates p-well and n-well regions. The well formation process is suitably accomplished by implanting selected impurity distributions into the appropriate well regions in conjunction with conventional masking steps. For example, for p-well regions ions of boron are implanted, and for n-well regions ions of phosphorous are implanted.

Prior to etching the opening 104, a silicon oxide layer 108 is formed on the surface of the substrate 102. The oxide layer 106 is approximately 50–200 Å and is formed, for example, with a plasma deposition, exposing the surface to dry oxygen and heat or other conventional methods. The nitride layer 110 is then formed on the oxide layer 108. Conventional CVD or plasma deposition can be used to form the nitride layer having thickness of approximately 300–1000 Å. The top oxide layer 112 is approximately 300–1000 Å and can be formed with conventional CVD and plasma deposition techniques.

A photo-resist mask pattern (not shown) is formed over the oxide layer 112 to pattern the opening 104. Then the opening 104 can be etched, for example, with a reactive ion etch. Alternatively, a wet etch with nitric and hydrofluoric acids can be used, for example. The photo-resist mask pattern is then removed using conventional stripping techniques.

The resulting opening 104 includes side-walls 114 and 116 and a base 118. It will be appreciated that the shape of the opening as shown is for illustration purposes only. Those skilled in the art will recognize that the opening may assume other shapes and proportions.

Figure 2:
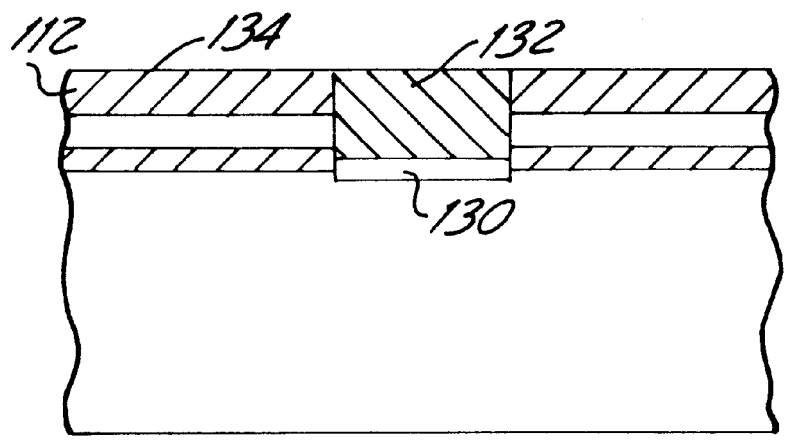
FIG. 2 is a partial cross-sectional view of a semiconductor structure including a gate dielectric and gate electrode.
Figure 3:
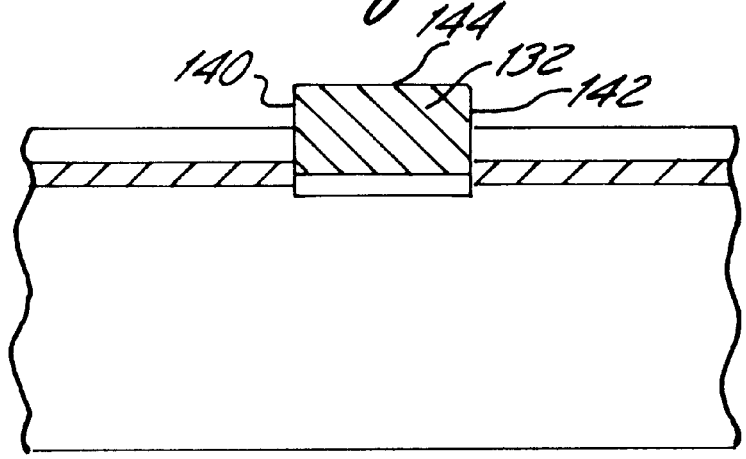
FIG. 3 is a partial cross-sectional view of a semiconductor structure including a gate electrode formed between an oxide-nitride-oxide stack in which the top oxide layer has been removed.

FIG. 2 is a partial cross-sectional view of a semiconductor structure including a gate dielectric 130 and gate electrode 132. The gate dielectric 130 is an oxide layer approximately 15–30 Å formed using conventional oxide growth techniques.

The gate electrode 132 is polysilicon, in an example embodiment, and is formed using conventional CVD techniques. In an example embodiment, a gate conductive layer (not shown) is deposited on the oxide layer 112. The deposition is accomplished by blanket depositing polysilicon in a chemical vapor deposition process to a thickness of approximately 4000–6000 Å and thereafter doping the polysilicon such that the gate conductive layer comprises a highly doped polysilicon film. For purposes of this disclosure, "highly doped polysilicon" is defined as polysilicon having a sheet resistance less than 500 Ohms/sq. Alternatively, the gate conductive layer may comprise titanium nitride, titanium tungsten, or other conductive material compatible with the process sequence.

The gate conductive layer is then planarized with the surface 134 of oxide layer 112 using a chemical-mechanical polish. The oxide layer 112 is thereafter removed, as shown in the partial cross-sectional view of FIG. 3. The oxide layer can be removed, for example, with an anisotropic oxide etch or a wet chemistry etch.

Removal of the oxide layer 112 exposes the sides 140 and 142, as well as the top surface 144 of the gate electrode 132. The exposure of the sides 140 and 142 and the top 144 of the electrode 132 is subsequently used in the process flow of FIG. 4 for oxidizing a portion of the gate electrode.

Figure 4:
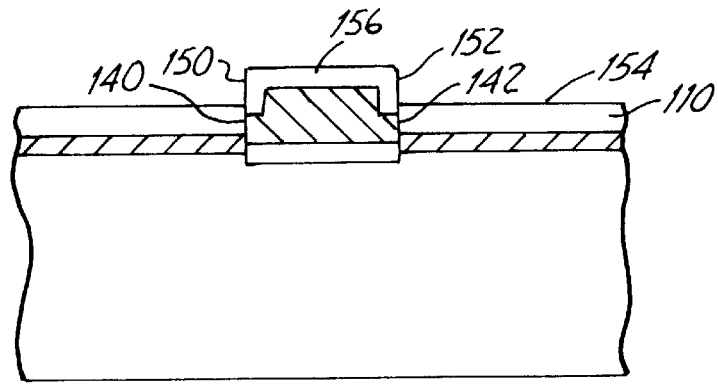
FIG. 4 is a partial cross-sectional view of a semiconductor structure including a partially oxidized gate electrode.

FIG. 4 is a partial cross-sectional view of a semiconductor structure including a partially oxidized gate electrode 132 formed in accordance with an example embodiment of the invention. The gate electrode 132 is partially oxidized to reduce its height and width. Because the nitride layer 110 shields a portion of sides 140 and 142 of the gate electrode 132, only portions 150 and 152 of the sides of the gate electrode are oxidized. It will be appreciated that the oxidized portion 156 has side portions that extend below the surface 154 of the nitride layer.

The gate electrode 132 can be oxidized as described above by using an oxide growth technique, such as for example with dry oxygen or with steam and hydrogen or $O_2$.

Figure 5A:
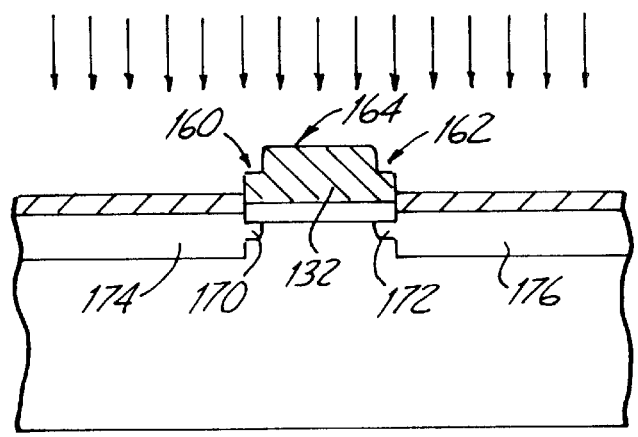
FIG. 5A is a partial cross-sectional view of a semiconductor structure undergoing a first implant.

Continuing now with FIG. 5A, after the gate is partially oxidized, as described above, the oxidized portion is stripped, along with the nitride layer 110. The oxidized portion 156 (FIG. 4) can be stripped, for example, with an anisotropic oxide etch or a wet chemistry etch. The nitride layer 110 can be stripped using a reactive ion etch or a wet etch. The remaining gate electrode 132 has reduced height side portions 160 and 162. That is, the middle portion 164 of the gate electrode has a height that is greater than the height of the gate electrode at its sides.

In one example embodiment shown in FIG. 5A, a single implant suffices for forming the LDD regions 170 and 172 and the source-drain regions 174 and 176. The reduced height side portions 160 and 162 of the gate electrode 132 allow the dopant to penetrate the substrate 102 below the reduced height portions, whereas the thicker middle portion 164 of the gate electrode shields the substrate from the dopant. The regions below the side portions of the gate electrode in which the dopant is implanted are the LDD regions 170 and 172. Relative to the LDD regions, the dopant penetrates further into the substrate 102 in regions that are adjacent the gate electrode because there is no masking by the gate electrode. Thus, it can be seen that the channel length is scaled by virtue of the reduced height side portions 160 and 162 of the gate electrode, and that the formation of the LDD regions 170 and 172 is integrated with the formation of the source-drain regions 174 and 176.

For an example p-channel device and a single dopant implant to form both the LDD and source-drain regions, a suitable dopant species is $B_{10}H_6$ implanted at approximately 2–20 keV with a dose rate of 2E15–6E15 ions/cm$^2$. For an n-channel device, a suitable dopant species is antimony implanted at approximately 5–30 kev with a dose rate of 2E15–6E15 ions/cm$^2$.

Figure 5B:
FIG. 5B is a partial cross-sectional view of a semiconductor structure undergoing a second implant.
Figure 5B:
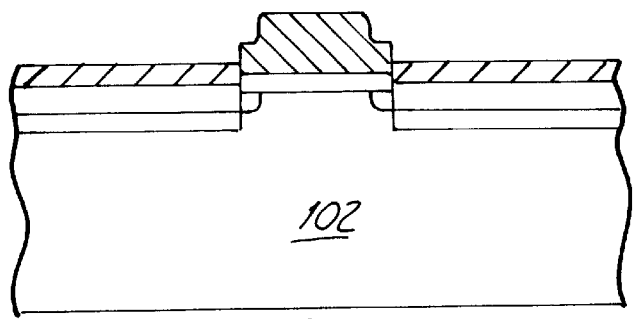

In another embodiment, two implants are performed. For example, the implant of FIG. 5B is of a different species from the implant of FIG. 5A.

In a two-step implant for an example p-channel device, the first implant of FIG. 5A is boron implanted at approximately 20–60 keV with a dose rate of approximately 1E14–1E15 ions/cm$^2$. Following the implant of FIG. 5A, a second implant of $BF_2$, or $B_{10}H_6$. for example, is performed. This second implant is illustrated in FIG. 5B. The energy level and dose rate for $BF_2$ or $B_{10}H_6$ are approximately 800 eV to 10 keV and 2E15–6E15, respectively.

For an example n-channel device for the first implant of FIG. 5A, the dopant species could be arsenic implanted at approximately 20–100 keV with a dose rate of approximately 1E14–1E15 ions/cm$^2$. Following the implant of FIG. 5A, a second implant with antimony, for example, is performed. The energy level and dose rate for antimony are approximately 800 eV to 10 keV and 2E15–6E15, respectively. Fabrication then continues with well-known processes to form a final structure.

The dimensions, shapes, dose rates, energy level, and materials set forth above are intended to serve as examples. Those skilled in the art will recognize that such process parameters could be varied accordingly to produce a gate electrode having different desired dimensions and operating characteristics.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

What is claimed is:

1. A process for making a semiconductor structure, comprising:
   providing a substrate;
   forming a gate dielectric layer on the substrate;
   forming a gate electrode including polysilicon on the gate dielectric layer, the gate electrode having a middle portion with a first height and side portions having heights that are less than the first height and having an exposed first surface opposite the gate dielectric layer and exposed side surfaces adjacent the first surface, the step of forming including oxidizing a portion of the gate electrode at the exposed surfaces to a selected depth, and removing the oxidized portion of the gate electrode, leaving the gate electrode with a middle portion that is thicker than its side portions; and;
   implanting at a first energy level a first concentration of a first dopant species into the substrate, wherein lightly doped drain regions are formed in the substrate below the side portions of the gate electrode and wherein the first energy level and first concentration of the first dopant species are sufficient for formation of source and drain regions in the substrate adjacent the gate electrode.

2. The process of claim 1, wherein the first energy level and first concentration of the first dopant species are sufficient for formation of source and drain regions in the substrate adjacent the gate electrode.

3. The process of claim 2, wherein the first species is antimony implanted at an energy level of approximately 5–30 keV with a dose rate of approximately 2E15–6E15 ions/cm$^2$.

4. The process of claim 2, wherein the first species is $B_{10}H_6$ implanted at an energy level of approximately 2–20 keV with a dose rate of approximately 2E15–6E15 ions/cm$^2$.

5. The process of claim 1, further comprising the step of implanting at a second energy level a second concentration of a second dopant species into the substrate to form source and drain regions in the substrate adjacent the gate electrode.

6. The process of claim 5, wherein the first species is arsenic implanted at approximately 20–100 keV with a dose rate of approximately 1E14–1E15 ions/cm$^2$.

7. The process of claim 6, wherein the second species is antimony implanted at an energy level of approximately 800 eV to 10 keV and a dose rate of approximately 2E15–6E15.

8. The process of claim 5, wherein the first species is boron implanted at a approximately 20–60 keV with a dose rate of approximately 1E14–1E15 ions/cm$^2$.

9. The process of claim 8, wherein the second species is selected from the group of $BF_2$ or $B_{10}H_6$ and is implanted at an energy level of approximately 800 eV to 10 keV and a dose rate of approximately 2E15–6E15.

10. The process of claim 1, further comprising implanting at a second energy level a second concentration of a second dopant species into the substrate.

11. A process for making a semiconductor structure, comprising:
    depositing a stack of oxide-nitride-oxide layers on a semiconductor substrate, leaving an exposed oxide layer;
    forming an opening in the stack at a selected location;
    forming a gate insulator at the base of the opening;
    depositing polysilicon material in the opening to form a gate electrode;
    removing the exposed oxide layer, whereby side surfaces of the polysilicon gate electrode are exposed;
    oxidizing a portion of the polysilicon gate electrode at exposed surfaces to a selected depth;
    removing the oxidized portion of the polysilicon material, leaving the polysilicon gate electrode having a middle portion that is thicker than its side portions;
    removing the nitride layer; and
    implanting at a first energy level a first concentration of a first dopant species into the substrate, whereby lightly doped drain regions are formed in the substrate below side portions of the polysilicon material.

12. The process of claim 11, wherein the opening has side walls that are substantially perpendicular to the oxide-nitride-oxide stack.

13. The process of claim 11, further comprising planarizing the polysilicon material with the exposed oxide layer.

14. The process of claim 11, wherein the first energy level and first concentration of the first dopant species are sufficient for formation of source and drain regions in the substrate adjacent the gate electrode.

15. The process of claim 14, wherein the first species is antimony implanted at an energy level of approximately 5–30 keV with a dose rate of approximately 2E15–6E15 ions/cm$^2$.

16. The process of claim 14, wherein the first species is $B_{10}H_6$ implanted at an energy level of approximately 2–20 keV with a dose rate of approximately 2E15–6E15 ions/cm$^2$.

17. The process of claim 11, further comprising implanting at a second enemy level a second concentration of a second dopant species into the substrate, whereby source and drain regions are formed in the substrate adjacent the gate electrode.

18. The process of claim 17, wherein the first species is arsenic implanted at approximately 20–100 keV with a dose rate of approximately 1E14–1E15 ions/cm$^2$.

19. The process of claim 18, wherein the second species is antimony implanted at an energy level of approximately 800 eV to 10 keV and a dose rate of approximately 2E15–6E15.

20. The process of claim 19, wherein the first species is boron implanted at approximately 20–60 keV with a dose rate of approximately 1E14–1E15 ions/cm$^2$.

21. The process of claim 20, wherein the second species is selected from the group of $BF_2$ or $B_{10}H_6$ and is implanted at an energy level of approximately 800 eV to 10 keV and a dose rate of approximately 2E15–6E15.

22. A process for making a semiconductor structure, comprising:

provBurkina a substrate;

forming a gate dielectric layer on the substrate;

forming a gate electrode including polysilicon on the gate dielectric layer, the gate electrode having a middle portion with a first height and side portions having heights that are less than the first height, the polysilicon gate electrode having an exposed first surface opposite the gate dielectric layer and exposed side surfaces adjacent the first surface, and the step of forming including oxidizing a portion of the polysilicon gate electrode at the exposed surfaces to a selected depth, and removing the oxidized portion of the polysilicon gate electrode to leave the polysilicon gate electrode with a middle portion that is thicker than its side portions;

implanting at a first energy level a first concentration of a first dopant species into the substrate, whereby lightly doped drain regions are formed in the substrate below the side portions of the gate electrode; and implanting at a second energy level a second concentration of a second dopant species into the substrate, wherein source and drain regions are formed in the substrate adjacent the gate electrode.

23. The process of claim 22, wherein the first energy level and first concentration of the first dopant species are sufficient for formation of source and drain regions in the substrate adjacent the gate electrode.

* * * * *